United States Patent [19]

Kober et al.

[11] Patent Number: 5,142,448

[45] Date of Patent: Aug. 25, 1992

[54] METHOD FOR MANUFACTURING RIGID-FLEXIBLE MULTILAYER CIRCUIT BOARDS AND PRODUCTS THEREOF

[76] Inventors: Horst Kober, Berggewann 5, 6940 Weinheim; Uwe Horch, Illerstrasse 2, 7070 Schwäbisch-Gmünd, both of Fed. Rep. of Germany

[21] Appl. No.: 650,481

[22] Filed: Feb. 5, 1991

[30] Foreign Application Priority Data

Feb. 5, 1990 [DE] Fed. Rep. of Germany ....... 4003345

[51] Int. Cl.⁵ ............................................. H05K 1/00
[52] U.S. Cl. ..................................... 361/398; 29/846; 29/852; 174/254
[58] Field of Search .................. 29/846, 852; 361/398, 361/412, 413; 174/254; 156/630, 631, 901

[56] References Cited

U.S. PATENT DOCUMENTS

| | | | |
|---|---|---|---|
| 4,715,928 | 12/1987 | Hamby | 29/846 |
| 4,931,134 | 6/1990 | Hatkevitz et al. | 29/846 |
| 5,004,639 | 4/1991 | Desai | 361/398 |
| 5,013,397 | 5/1991 | Tsukakoshi | 29/846 |

FOREIGN PATENT DOCUMENTS 8872   1/1979   Japan .................................... 29/846

*Primary Examiner*—P. W. Echols
*Attorney, Agent, or Firm*—Kenyon & Kenyon

[57] ABSTRACT

A method for manufacturing rigid-flexible multilayer printed circuit boards and the products thereof. The method comprises the compression molding several layers of materials comprised of a rigid layer, a flexible insulating layer, adhesives, and conductive metal to form a laminate. Flexibility is provided in the printed circuit board by slots in the rigid layer which define the flexible region, the application of flexible insulating material over the defined flexible region, and the removal of the rigid material which occupied the defined flexible region (plug). As disclosed by the present method, a flexible insulating layer is provided in the flexible regions only without the use of preliminary laminates. This method does not require the use of pressure equalizing cushions and does not result in relief formation on an upper layer of conductive metal during compression molding. After forming the composite laminate, it may be shaped as desired, and plated through holes may be provided in the rigid layer by known techniques.

23 Claims, 2 Drawing Sheets

FIG. 2
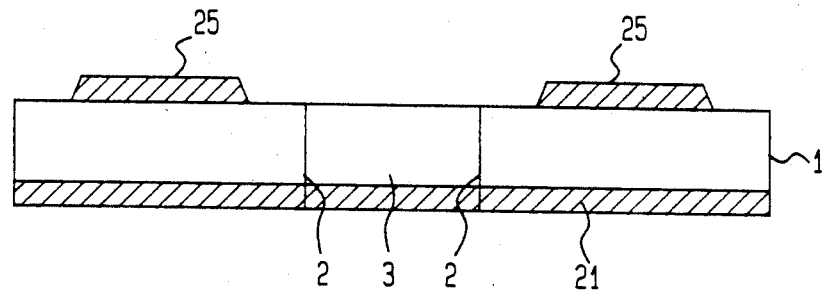
FIG. 3
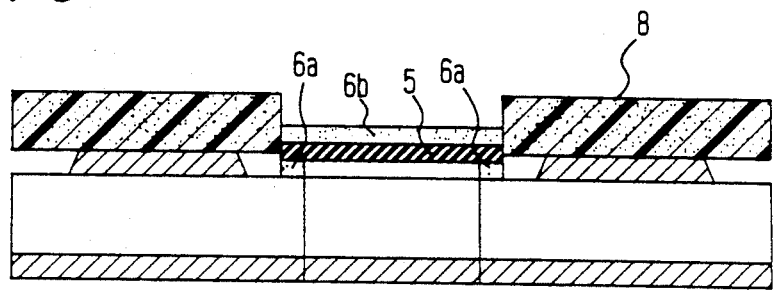
FIG. 4
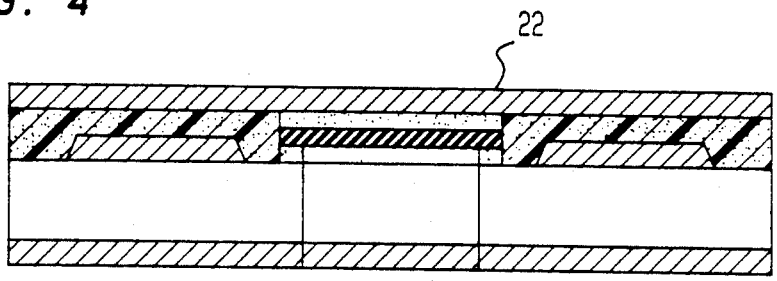
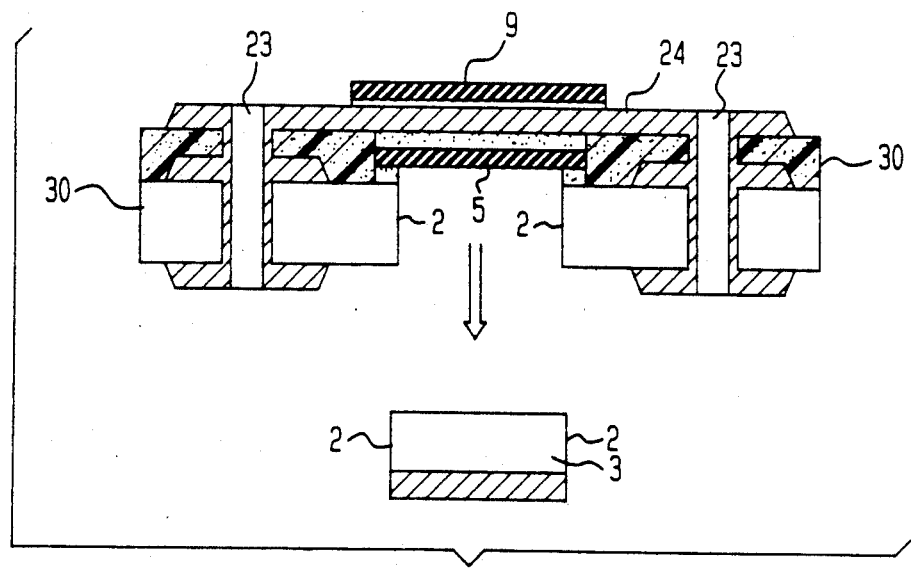
FIG. 5

METHOD FOR MANUFACTURING RIGID-FLEXIBLE MULTILAYER CIRCUIT BOARDS AND PRODUCTS THEREOF

The present invention relates to a method for manufacturing rigid-flexible printed circuit boards having flexible regions defined by a flexible insulating material bonded to a rigid region.

BACKGROUND OF THE INVENTION

Printed circuit boards are well known and have numerous applications. Printed circuits are used in almost all types of electronic equipment ranging from radio and television sets, telephone systems units, automobile electronic wiring, guided-missile and airborne electronic equipment, computers, and industrial control equipment. The printed circuit board has evolved from one-sided printed circuit boards to two-sided through-connected printed circuit boards, to multilayer circuitry, and to flexible circuitry.

Flexible printed circuits are useful in applications where flexing is a functional requirement, such as where flexing facilitates assembly and disassembly, or other dimensional variations need to be accommodated. Conventional flexible circuit materials include the flexible plastic films KAPTON, NOMEX, and TEFLON (trademarks of Du Pont). These materials provide flexibility, stability, and heat resistance, and are bondable to copper sheets for the formation of a printed circuit board, and to themselves to provide an insulating layer for the printed circuit and/or to facilitate the construction of multilayer boards.

Multilayer printed circuit boards increase the available surface area in an available space for the mounting of circuits and circuit parts. Conventional multilayer circuit boards comprise a number of boards having etched copper foil circuits disposed thereon, separated by an insulating layer, e.g., prepreg, and laminated or compression molded together under controlled temperature, pressure, and time. The circuits defined by the various conductor layers are connected by through holes and connection holes which are drilled and plated by traditional methods.

Rigid-flexible circuit boards are generally composed of separate rigid and flexible layers which are bonded together. The separate layers are either rigid or flexible insulating substrates which can be provided on one or both sides with a copper laminate (circuit). The shape of the rigid layers defines the rigid area of the printed circuit board. The flexible layers are, therefore, defined by the shape of the rigid layer. The flexible regions of the printed circuit board join the rigid regions of the circuit together or provide flexible connections to external assemblies. Electrical connection between the copper layers is provided by plated through holes.

German Patent DE 36 24 718 describes a rigid-flexible printed circuit board which has flexible regions constructed with flexible, adhesive coated plastic layers. These layers are free of peripheral gaps. When the individual layers are manufactured, a tool is used to punch or cut notches in preimpregnated boards (prepregs). These notches are somewhat larger than the desired flexible region of the printed circuit board. Plastic layers, which have been similarly prepared, are inserted into the prepregs. The thickness of the prepregs may be the same as the thickness of the plastic layer. Copper foil is applied on the top and bottom of a preliminary laminate to form a composite. This composite is compression molded. Printed circuit patterns are subsequently etched in the copper foils.

U.S. Pat. No. 4,715,928 describes a method for manufacturing single layer rigid-flexible printed circuit boards. These printed circuit boards include one layer of printed circuit. The use of flexible polyimide films, possibly precoated with glue, to provide the desired flexible region in the finished printed circuit board is disclosed. The flexible film may be bonded to the rigid region through the use of prepregs.

A rigid-flexible printed circuit board which has defined regions of mechanically laid wire conductors is disclosed by U.S. Pat. No. 4,533,787. This printed circuit board is provided with slots which define flexible regions. The slots may be cut so as to provide for crosspieces in the slots. The slots are introduced before application of a flexible film. Ultimately, the region surrounded by the slots is removed.

U.S Pat. No. 4,533,787 also discloses that a composite film, which does not act as an insulating film, may be situated in the slots. The composite comprises a thermoplastic layer between two sheets of non-adhesive separator film (sold under the trade name CONTIFLEX CONFORMAL COATING). The thermoplastic layer flows into the slots during compression molding to prevent other layers which lie above it from sagging into the slot.

German Patent DE 31 19 884 is directed to a method for manufacturing rigid-flexible printed circuit boards. This method employs a bonding foil arranged on a flexible layer, and a sheet-metal plate coated, e.g., by spraying, with liquid polytetrafluoroethylene. The contour of the sheet-metal plate corresponds to the form of the planned flexible regions. The flexible layer is compression molded with the rigid layer in the area of the bonding foil to form a composite. Printed circuits are formed on the rigid layer. Slots are provided in the composite. A section of the rigid layer may be removed together with the sheet-metal plate.

German Patent DE 26 57 212 relates to a method for producing composite rigid-flexible printed circuit boards having two or more insulating individual layers. The printed circuit boards have adjacent rigid and flexible areas made by pressing together separate rigid and flexible insulating layers with the aid of bonding sheets. Portions of the rigid layer may be removed to provide the desired flexible areas. This method discloses flexible layers that cover the entire printed circuit board German Patent DE 26 57 212 discloses a rigid-flexible printed circuit board having slots introduced on a side turned toward a flexible layer before compression molding. The slots define flexible and rigid regions of the printed circuit board. The depth of the slots may correspond to approximately one-half the thickness of the rigid material. After compression molding and formation of printed circuits on the external surfaces, additional slots may be produced in a similar manner but on the opposite side of the rigid layer. The rigid layer occupying the desired flexible regions can be removed along the separating lines of the slots.

German Patent DE 26 57 212 discloses rigid-flexible printed circuit boards that use adhesive layers which flow during compression molding. Since the material within the slots must eventually be removed, isolating foils are used to prevent the adhesive agent from flowing onto the material which is located in the flexible region. The plastic films used for the flexible layers in these printed circuit boards may be hygroscopic, so that when the circuit arrangement is soldered, delaminations can occur between the flexible and the rigid layers due to the vaporization of absorbed moisture.

Generally, it is also possible to use a non-flowing adhesive agent between the rigid and flexible single layers of rigid-flexible printed circuit boards. The viscosity of the non-flowing adhesive agent is such that it does not flow into the flexible areas during compression molding. Thus, the areas of bonding by the non-flowing adhesive can be controlled. These types of adhesive agents, however, require the application of a known pressure-equalizing cushion during compression molding in order to attain a homogeneous bonding of the flexible and rigid single layers. When circuit-board conductors are also present on a rigid single layer that is located in the interior of a multilayer printed circuit board, this cushion may cause the printed circuit to press into the flexible single layer. The result is a relief formation on the flexible single layer which in turn causes a relief formation on the copper foil applied to the outer flexible layer. Thus, the manufacture of circuitboard conductors on this copper foil using etching techniques is more difficult.

SUMMARY AND OBJECTS OF THE INVENTION

It is an object of the present invention to provide a simple method for manufacturing a printed circuit board having multiple layers of printed circuits and which also has both rigid and flexible regions.

It is also an object of the present invention to provide a method for manufacturing a rigid-flexible multilayer printed circuit board that involves the application of flexible insulating material only in the flexible regions of the circuit board without requiring rigid-flexible preliminary laminates.

It is a further object of the present invention to provide a method for manufacturing a rigid-flexible multilayer printed circuit board that does not require the application of pressure equalizing cushions, and does not result in relief formation in an outer layer of conductive metal during compression molding.

It is another object of the present invention to provide a method for manufacturing a rigid-flexible multilayer printed circuit board where the type of adhesive used in the rigid and flexible regions is not limited to prepregs, and where the thickness of the rigid layer may be determined independently of the thickness of the flexible regions.

The invention provides a method for making a rigid-flexible circuit board, comprising the steps of forming a slot which defines a removable plug in a rigid circuit board, the board comprising a rigid layer disposed between first and second conductive layers; forming a bonded region between a flexible insulating layer and the rigid circuit board that does not prevent removal of the plug; applying a prepreg to the circuit board on the same side as the flexible insulating layer, so that the prepreg does not cover the flexible insulating layer; applying a third conductive layer to a surface defined by exposed portions of the circuit board, the flexible insulating layer, and the prepreg to form a composite A; and removing the plug to form a flexible region in the rigid circuit board.

BRIEF DESCRIPTION OF THE DRAWINGS

FIGS. 2 to 4 are cross section views illustrating the various steps of a process for fabricating a rigid-flexible multilayer printed circuit board in accordance with this invention.

FIG. 5 is a cross section view of a rigid-flexible multilayer printed circuit board.

DETAILED DESCRIPTION OF THE INVENTION

Figure 1:
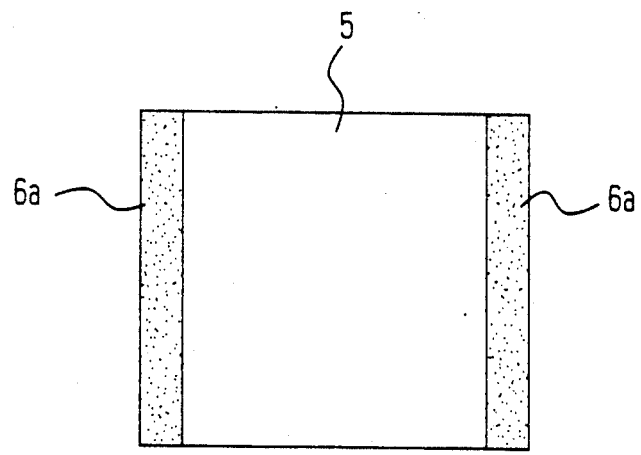
FIG. 1 is a top plan view of the flexible insulating material with non-flowing adhesive applied to the overlapping regions.

The method according to the invention begins with a rigid layer (1) which preferably comprises a fiberglass reinforced epoxy resin. This rigid layer (1) is disposed (sandwiched) between a first and second conductive layer (21 and 25), which are preferably copper. A circuit (25) is provided in one conductive layer surface to produce a rigid circuit board.

Slots (2) are cut into the rigid circuit board. These slots (2) define a plug (3) that is later removed to form a flexible region in the rigid circuit board. The slots (2) are provided before compression molding and pass through the entire thickness of the rigid circuit board. The slots (2) may be fashioned, e.g., as rupture joints, so as to hold the plug (3) in place until removal is desired. These slots (2) can be produced using known techniques. By following the disclosed method one can avoid the risk of damaging the flexible insulating layer (5) which may result when the slots (2) are produced after compression molding.

After the slots (2) are introduced, a flexible insulating layer (5), preferably polyimide, is applied to the circuit side of the rigid circuit board. The flexible insulating layer (5) is situated so that it covers the plug (3), extends over the slot (2), and overlaps with the rigid layer (1) forming a bonding region with the rigid circuit board. The flexible insulating layer (5) and bonding region do not prevent the removal of the plug (3). Preferably, the bonding region between the flexible insulating layer (5) and rigid layers (1) has a width of about 3 to 5 mm on all sides of the slot (2).

The flexible insulating layer (5) is attached to the rigid layer (1) with an adhesive (6a) preferably a non-flowing adhesive, that does not bond the flexible insulating layer (5) to the plug (3). The region between the rigid layer (1) and flexible insulating layer (5) to which the adhesive (6a) is applied defines the bonding region. Preferably, the adhesive is applied only in the region of overlap between the flexible insulating layer (5) and the underlying rigid layer (1) only. There is no application of adhesive to the flexible insulating layer (5) that covers the region located within the slot (2).

The adhesive (6a) has sufficient viscosity so that it does not flow during compression molding. Thus, precise areas of bonding can be achieved. The adhesive (6a) may be, for example, an adhesive tape, which is prepositioned either on the flexible insulating layer (5), or on the rigid layer (1).

The flexible insulating layer (5) may be further treated with an adhesive (6b) on its side farthest from the 27 rigid circuit board. This additional adhesive layer (6b) preferably remains flexible in its hardened state.

Prepreg (8), which may have the same resinous composition as the rigid layer (1), is subsequently applied so to cover the rigid circuit board on the side to which the flexible insulating layer (5) has been applied to form a composite A. The prepreg (8) does not cover the flexible insulating layer (5). The prepreg (8) may have thickness equal to, or greater, up to about 2 micrometers, than the flexible insulating layer (5), combined with the adhesive layers (6a and 6b).

A third conductive layer (22), preferably copper, is applied over the prepreg side of the composite A to form a composite B. Adhesive does not need to be applied to the third conductive layer (22). Bonding to the composite is effected by the prepreg (8) and adhesive (6b) present on the outer surface of the flexible insulating layer (5).

The composite B is then compression molded into a laminate. At the beginning of compression molding, the prepreg (8), being of low viscosity, surrounds the flexible insulating layer (5) in a manner that is free of air, and embeds the circuits (25) on the rigid circuit board. The adhesive layers (6a, 6b, and prepreg (8)) bonds all the layers together.

During compression molding, prepreg (8) flows quickly and the prepreg (8) produces a pressure-equalizing effect. This characteristic enables one to dispense with additional pressureequalizing cushions during the compression molding. Thus, this method produces a flat laminate with a smooth conductive layer surface (22).

An advantage of the present invention is that one can vary the selection of adhesive layers that are applied in the rigid and flexible regions. In the rigid regions, prepregs customarily used in multilayer printed circuit boards are applied, and in flexible regions, the flexible insulating layer (5) may be treated with a flexible adhesive agent.

The prepreg (8) may also function as an insulating layer. The prepreg (8) provides a levelling compensation effect relative to the thickness of the flexible insulating layer (5). Thus, another advantage of the present invention is that the thickness of both the rigid and flexible regions can be varied over a wide range when designing the rigid-flexible printed circuit boards. The thickness of the rigid layer (1) does not have to be precisely adjusted to the thickness of the flexible insulating layer (5) in the flexible region. Rather, the thickness of the rigid layer (1) can be determined based on the requirements of any component parts in the rigid region and independently of the thickness of the flexible insulating layer (5).

The region of the rigid circuit board covered by the flexible insulating layer (5), i.e., plug (3), is then removed. Its removal is facilitated by the previously introduced slots (2). Removal of the plug (3) maybe further facilitated by first providing a contour (30) to the board.

Plated through-holes (23) in the rigid regions and printed circuitry (24) in the conductive metal of the upper layer may be provided in the assembly using known methods for rigid multilayer printed circuit boards.

Optionally, an additional flexible insulating layer (9) may be applied to the assembly for increased mechanical strength and/or insulation. The region covered by the additional flexible insulating layer (9) is essentially that of the flexible regions of the circuit board.

What is claimed is:

1. A method for making rigid-flexible circuit boards, comprising the steps of:
   (a) forming a slot which defines a removable plug in a rigid circuit board, the board comprising a rigid layer disposed between first and second conductive layers;
   (b) bonding a flexible insulating layer to a side of the rigid circuit board to form a bonded region wherein the bonded region of the flexible insulating layer to the rigid circuit board does not prevent removal of the plug and the flexible insulating layer bridges the rigid circuit board adjacent to the removable plug;
   (c) applying a prepreg to the circuit board on the same side as the flexible insulating layer, wherein the prepreg does not cover the flexible insulating layer;
   (d) applying a third conductive layer to a surface defined by the flexible insulating layer, and the prepreg to form a composite A; and
   (e) removing the plug to form a flexible region in the rigid circuit board.

2. The method of claim 1 wherein the slot comprises a rupture joint.

3. The method of claim 1 wherein the flexible insulating layer is bonded to the circuit board with an adhesive.

4. The method of claim 3 wherein the bonded region has a width of 3 to 5 mm on all sides of the slot.

5. The method of claim 3 further comprising the step of coating an exposed surface of the flexible insulating layer with an adhesive that will remain flexible when hardened.

6. The method of claim 5 wherein the prepreg has a thickness equal to or slightly greater than the flexible insulating layer combined with the adhesives.

7. The method of claim 6 wherein the prepreg has a thickness about 2 micrometers thicker than the flexible insulating layer combined with the adhesives.

8. The method of claim 7 further comprising the step of compression molding the composite A to form a laminated composite B.

9. The method of claim 6 further comprising the step of compression molding the composite A to form a laminated composite B.

10. The method of claim 9 further comprising the step of providing a circuit in the third conductive layer.

11. The method of claim 9 further comprising the step of shaping the laminated composite to facilitate the removal of the plug.

12. The method of claim 1 wherein the prepreg may have the same resinous composition as the rigid layer.

13. The method of claim 1 further comprising the step of compression molding the composite A to form a laminated composite B.

14. The method of claim 13 further comprising the step of applying a second flexible insulating layer to composite B covering a flexible region of board.

15. The method of claim 13 further comprising the step of providing electrical communication means between the conductive layers.

16. The method of claim 15 wherein the electrical communication means comprises through holes.

17. The method of claim 15 wherein the electrical communication means comprises through holes.

18. The method of claim 1 further comprising the step of providing a contour to the composite A wherein the contour intersects with the slot.

19. A method for making a rigidflexible multilayer printed circuit board, comprising the steps of;
   (a) forming a rupture joint which defines a removable plug in a rigid circuit board, the board comprising a rigid layer of fiberglass reinforced epoxy resin disposed between first and second conductive layers of copper, one conductive layer defining a circuit side on said circuit board;

(b) forming a bonded region between a flexible insulating layer of polyimide and the rigid circuit board that does not prevent removal of the plug, wherein the flexible insulating layer is bonded to the rigid circuit board with a non-flowing adhesive on a circuit side of the board, the bonded region has a width of at least 3 mm on all sides, and an exposed surface of the flexible insulating layer is coated with an adhesive that will remain flexible when hardened;

(c) applying a prepreg of epoxy resin to the circuit board on its circuit side so that the prepreg does not cover the flexible insulating layer, wherein the prepreg does not cover the flexible insulating layer, wherein the prepreg has equal thickness or has a thickness about 2 micrometers more than the flexible insulating layer combined with the adhesive;

(d) applying a third conductive layer of copper to a surface defined by the flexible insulating layer, and the prepreg to form a composite A;

(e) compression molding the composite A to form a laminated composite B;

(f) providing plated through holes between the conductive layers;

(g) providing a circuit in the third conductive layer;

(h) providing a contour to the laminated composite wherein the contour intersects with the rupture joint; and (i) removing the plug to form a flexible region in the rigid circuit board.

20. The method of claim 19 wherein the bonded region has a width of 3 to 5 mm.

21. A circuit board, comprising:

a rigid layer having disposed thereon at least one conductive layer and a removable plug defined by slots in the rigid layer;

a flexible insulating layer bonded to a side of the rigid layer to form a bonded region, wherein the bonded region of the flexible insulating layer to the rigid layer does not prevent removal of the plug;

a continuous adhesive layer on the same side as the flexible insulating layer to form a composite; and an outer conductive layer on a surface of said composite.

22. A circuit board of claim 21 wherein the bonded region has a width of at least 3 mm.

23. A circuit board of claim 21 wherein the bonded region has a width of 3 to 5 mm.

* * * * *